Figure 1:
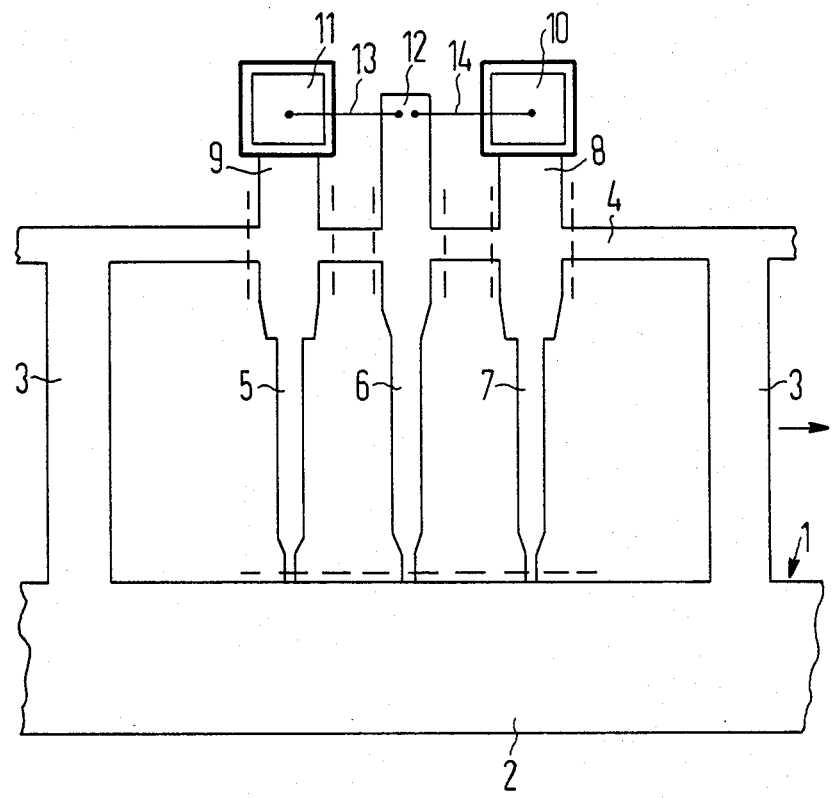

United States Patent [19]

Wurz

[11] Patent Number: 4,532,538

[45] Date of Patent: Jul. 30, 1985

[54] SEMICONDUCTOR ARRANGEMENT WITH CONNECTOR CONDUCTORS CUT OUT OF SHEETMETAL

[75] Inventor: Erwin Wurz, Eichenau, Fed. Rep. of Germany

[73] Assignee: Siemens Aktiengesellschaft, Berlin und Munich, Fed. Rep. of Germany

[21] Appl. No.: 347,030

[22] Filed: Feb. 8, 1982

[30] Foreign Application Priority Data

Feb. 20, 1981 [DE] Fed. Rep. of Germany ....... 3106379

[51] Int. Cl.³ .................... H01L 25/02; H01L 23/48
[52] U.S. Cl. ................................. 357/70; 357/65; 357/75; 357/68
[58] Field of Search .............. 357/70, 65, 68, 75, 357/76

[56] References Cited

U.S. PATENT DOCUMENTS

| 3,490,141 | 1/1970 | Lesk | 357/76 |
| 3,602,983 | 9/1971 | Bertioli | 357/70 |
| 3,619,734 | 11/1971 | Assour et al. | 357/76 |
| 3,717,800 | 2/1973 | Thillays et al. | 357/68 |
| 3,908,184 | 9/1975 | Anazawa et al. | 357/75 |
| 4,142,203 | 2/1979 | Dietz | 357/80 |
| 4,322,735 | 3/1982 | Sadamasa et al. | 357/75 |

FOREIGN PATENT DOCUMENTS

| 1614567 | 4/1975 | Fed. Rep. of Germany . | |
| 1516465 | 3/1968 | France | 357/70 |
| 55-5650 | 4/1980 | Japan | 357/70 |
| 1394080 | 5/1975 | United Kingdom | 357/76 |

OTHER PUBLICATIONS

IBM Disclosure Bulletin–"Power Hybrid Module"–C. Liu and W. L. Wright–vol. 16, No. 5–Oct. 1973.

Primary Examiner—Andrew J. James
Assistant Examiner—Sheila V. Clark
Attorney, Agent, or Firm—Herbert L. Lerner; Laurence A. Greenberg

[57] ABSTRACT

Semiconductor arrangement with at least two semiconductor members having connector conductors cut out of sheetmetal and formed with main surfaces and sectional planes, at least one of the connector conductors having contact surfaces on one of the main surfaces thereof, one side of a respective one of the semiconductor members being mechanically fastened and electrically contacted with the contact surfaces, including a respective support point on one of the other connector conductors, and at least one bond wire, respectively, connecting the other side of the semiconductor members to the respective support points, the bond wires being disposed parallel to one another.

1 Claim, 2 Drawing Figures

SEMICONDUCTOR ARRANGEMENT WITH CONNECTOR CONDUCTORS CUT OUT OF SHEETMETAL

The invention relates to a semiconductor arrangement having at least two semiconductor bodies or members with connector conductors or terminal leads cut out of sheetmetal and formed with main surfaces and sectional-plane surfaces, at least one of the connector conductors having contact surfaces on one of the main surfaces thereof, one side of a respective one of the semiconductor members being mechanically fastened and electrically contacted with the contact surfaces.

Such a semiconductor arrangement has been described heretofore, for example, in German Pat. No. 16 14 567. In this heretofore-known semiconductor arrangement, a respective semiconductor arrangement is clamped in such a manner between clamping lugs of two adjacent connector conductors mutually joined by a bridge or strip, that the clamping lug of one of the connector conductors engages the upper side and the clamping lug of the other connector conductor the underside of the semiconductor member. The semiconductor member and the clamping lugs are provided with solder so that the semiconductor member and the connector conductors can be soldered together, for example, in a once-through furnace. To achieve optimal soldering, the clamping lugs must exert a pressure upon the semiconductor member which is as exactly defined as possible. This is especially difficult when the semiconductor arrangement contains many semiconductor members, such as four semiconductor members, for example, in the case of a full-wave rectifier bridge. In such a case, great demands are made upon the accuracy or exactness, for example, of the thickness of the solder layer and the thickness of the semiconductor member.

It is, accordingly, an object of the invention to provide a semiconductor arrangement with connector conductors cut out of sheetmetal wherein the aforementioned demands upon accuracy are reduced.

With the foregoing and other objects in view, there is provided, in accordance with the invention, a semiconductor arrangement with at least two semiconductor members having connector conductors cut out of sheetmetal and formed with main surfaces and sectional planes, at least one of the connector conductors having contact surfaces on one of the main surfaces thereof, one side of a respective one of the semiconductor members being mechanically fastened and electrically contacted with the contact surfaces, comprising a respective support point on one of the other connector conductors, and at least one bond wire, respectively, connecting the other side of the semiconductor members to the respective support points, the bond wires being disposed parallel to one another.

In accordance with another feature of the invention, the bond wires are disposed in tandem alignment.

In accordance with a concomitant feature of the invention, the semiconductor arrangement includes a plurality of adjacent groups of tandem-disposed semiconductor members, the parallel bond wires of each of the groups of semiconductor members being disposed in tandem alignment.

Although it has become known heretofore from U.S. Pat. No. 4,142,203 to connect a semiconductor member to connector conductors by bond wires, the patentee is concerned with an integrated circuit, however, wherein the connector conductors are disposed in the form of a spider around the semiconductor members. The connector conductors are connected to the semiconductor member by bond wires extending radially away from the semiconductor member. In this heretoforeknown construction, relatively high expense is incurred during bonding because the bonding device must be displaceable in all three coordinate directions. In the semiconductor arrangement according to the invention of the instant application, this is unnecessary.

Other features which are considered as characteristic for the invention are set forth in the appended claims.

Although the invention is illustrated and described herein as embodied in a semiconductor arrangement with connector conductors cut out of sheetmetal, it is nevertheless not intended to be limited to the details shown, since various modifications and structural changes may be made therein without departing from the spirit of the invention and within the scope and range of equivalents of the claims.

Figure 2:
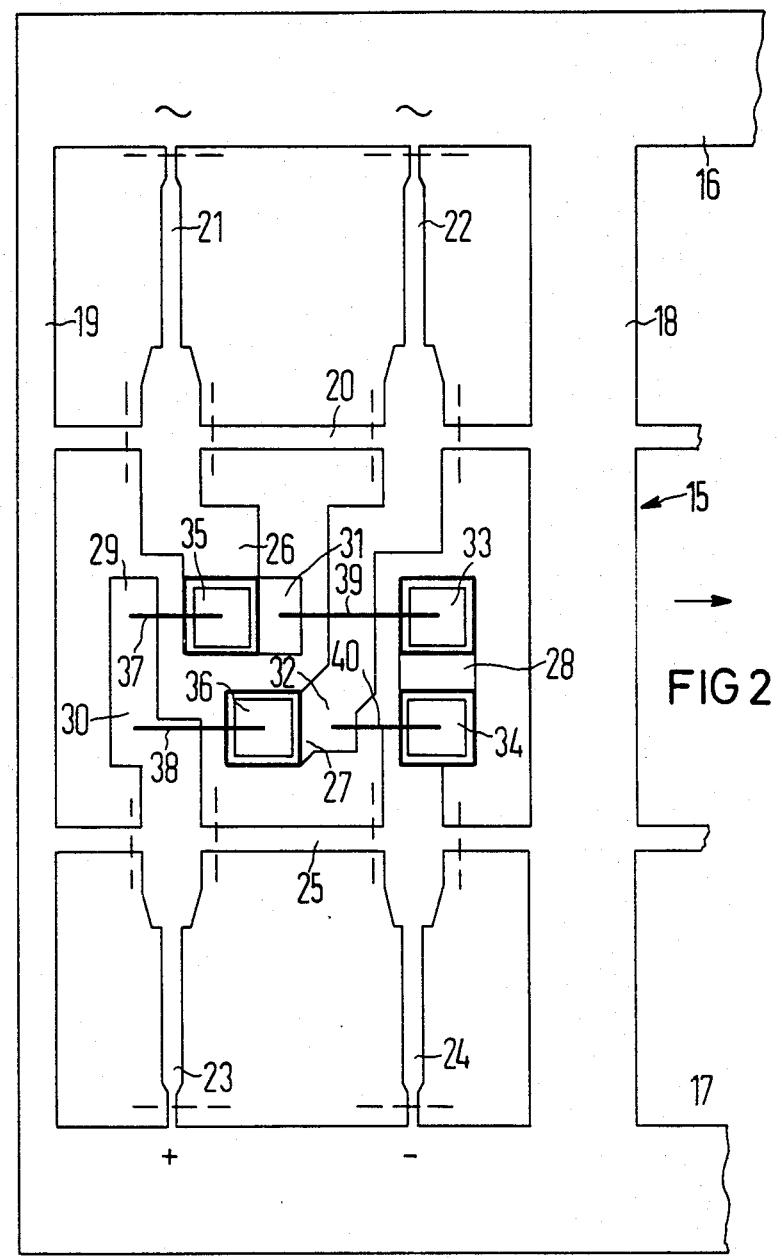

The construction and method of operation of the invention, however, together with additional objects and advantages thereof will be best understood from the following description of specific embodiments when read in connection with the accompanying drawings, in which:

FIGS. 1 and 2 are diagrammatic top plan views of different embodiments of non-encapsulated semiconductor arrangements or layouts according to the invention.

Referring now to the drawing and, first, particularly to FIG. 1 thereof, there is shown therein a semiconductor arrangement with a midpoint or center-tap connection. It has a conductor system 1 cut out of sheetmetal. This is produced, for example, by stamping or punching a metal sheet traveling in direction of the indicated arrow i.e. towards the right-hand side of FIG. 1. The stamping or punching operation produces a longitudinal strip 2, a transverse strip 3 and a seal strip 4. Furthermore, connector conductors 5, 6 and 7 are punched or stamped out of the metal sheet. The conductor system accordingly has main surfaces of which one is presented to the viewer of FIG. 1, and sectional planes disposed perpendicularly to the main surfaces. The connector conductors 5 and 7 have contact surfaces 9 and 8, respectively, whereon semiconductor members 11 and 10, respectively, are seated. These surfaces of the semiconductor members 11 and 10 which are seated on the contact surfaces 9 and 8, respectively, are connected to the latter, for example, by soldering or application of adhesive. The semiconductor members 11 and 10 are thus mechanically supported and electrically contacted. The middle connector conductor 6 carries a support point or extension 12 located opposite the contact surfaces 8 and 9.

The contact surfaces 8 and 9 and the support extension 12 are disposed in tandem i.e. one behind the other, as viewed in direction of the aforementioned arrow i.e. in travel or feed direction of the metal sheet. The other sides of the semiconductor members 11 and 10 are electrically connected by a respective bond wire 13, 14 to the support point or extension 12. The bond wires 13 and 14 are disposed in tandem alignment i.e. one behind the other, and thus parallel to one another. They are, moreover, disposed parallel to the direction of travel or feed of the metal sheet. They may also be disposed perpendicularly to the connector conductors 5, 6 and 7 and the hereinaforementioned sectional planes.

Due to the parallel disposition, bonding is especially simplified, because the bonding device need move only in two coordinate directions while the conductor system is held stationary. When the bonding operation is coordinated with the travel or feed of the conductor system, a single-dimensional displacement of the bonding device is sufficient under certain conditions.

After the semiconductor members 10 and 11 have been connected with the connector conductors 5, 6 and 7, plastic or synthetic material, for example, is pressed around the semiconductor arrangement. Then, the connector conductors 5, 6 and 7 and the seal strip 4 are severed at the illustrated broken lines.

In FIG. 2, a full-wave rectifier bridge is shown having a conductor system 15 cut out of sheetmetal and including two longitudinal strips 16 and 17 and two transverse strips 18 and 19, as well as two dense strips 20 and 25. The full-wave rectifier bridge of FIG. 2 has four conductor connectors 21, 22, 23 and 24, which are connected to the respective longitudinal strip 16 and 17. The connector conductor 21 has, at one end thereof, a contact surface 26 on which a semiconductor member 35 is seated. It, moreover, has a support point or extension 31 to which a bond wire 39 is applied. The connector conductor 22 carries a contact surface 27 whereon a semiconductor member 36 is seated, as well as a support point or extension 32 for a bond wire 40. The connector conductor 23 has two support points or extensions 29 and 30 for two bond wires 37 and 38, respectively. The connector conductor 24 has a contact surface 28 provided for receiving thereon two semiconductor members 33 and 34. All of the semiconductor members of the full-wave rectifier bridge of FIG. 2 are disposed in tandem in two adjacent groups.

The contact surfaces belonging to the semiconductor members 35 and 33 and the support points or extensions thereof are disposed in tandem i.e. one behind the other, as viewed in travel or feed direction as represented by the associated arrow i.e. towards the right-hand side of FIG. 2. The bond wires 37 and 39 may be disposed in tandem alignment i.e. behind one another, resulting in the hereinaforementioned acceleration of the bonding operation. Likewise, the contact surfaces and support points or extensions associated with the semiconductor members 36 and 34 are disposed in tandem i.e. one behind the other, as viewed in direction of feed or travel of the metal sheet. The bond wires 38 and 40 may also be disposed in tandem alignment.

As shown in FIG. 2, the contact surfaces and support points or extensions, as seen from the main surfaces of the conductor system 15, are cranked one or more times. This is suggested for optimal use of the available space if a fixed distance or spacing between the connector conductors 21 and 22, on the one hand, and 23 and 24, on the other hand, is prescribed. If the spacing between the respective connector conductors is freely selectable, the support points or extensions and the contact surfaces, as in FIG. 1, may be of strip-like construction.

I claim:

1. A rectifier bridge having four semiconductor members comprising four connector conductors cut out of sheetmetal, a first one of said connector conductors (23) having a first support point (29) for a first bond wire (37) and a second support point (30) for a second bond wire (38), a second one of said connector conductors (21) having a contact surface (26) whereon a first one of the four semiconductor members (35) is seated and a support point (31) for a third bond wire (39), a third one of said connector conductors (22) having a contact surface (27) for a second one of the four semiconductor members (36) and a support point (32) for a fourth bond wire (40), a fourth one of said connector conductors (24) having a contact surface (28) whereon a third and a fourth one of the four semiconductor members (33 and 34) are seated; said first support point (29) on said first connector conductor (23), said contact surface (26) on the first semiconductor member (35), said support point (31) on said second connector conductor (21) and said contact surface (28) for the third semiconductor member (33) being serially connected, said first bond wire (37) and said third bond wire (39) being in tandem alignment with one another; said second support point (30) of said first connector conductor (23), said contact surface (27) for the second semiconductor member (36), said support point (32) of said third connector conductor (22) and said contact surface (28) for the fourth semiconductor member (34) being serially connected, said second bond wire (28) and said fourth bond wire (40) being in tandem alignment with one another.

* * * * *

UNITED STATES PATENT AND TRADEMARK OFFICE
CERTIFICATE OF CORRECTION

PATENT NO. : 4,532,538
DATED : July 30, 1985
INVENTOR(S) : Erwin Wurz

It is certified that error appears in the above-identified patent and that said Letters Patent are hereby corrected as shown below:

In the heading to the printed specification, item /‾30‾/ line 11, "February 20, 1981 /‾DE‾/ Fed. Rep. of Germany...3106379", should read --February 20, 1981 /‾DE‾/ Fed. Rep. of Germany...3106376--.

Signed and Sealed this

Twenty-ninth Day of October 1985

[SEAL]

Attest:

Attesting Officer

DONALD J. QUIGG

Commissioner of Patents and Trademarks—Designate